(12) United States Patent
Kirby

(10) Patent No.: US 10,964,654 B2
(45) Date of Patent: Mar. 30, 2021

(54) 3DI SOLDER CUP

(71) Applicant: Micron Technology, Inc., Boise, ID (US)

(72) Inventor: Kyle K. Kirby, Eagle, ID (US)

(73) Assignee: Micron Technology Inc., Boise, ID (US)

(*) Notice: Subject to any disclaimer, the term of this patent is extended or adjusted under 35 U.S.C. 154(b) by 0 days.

(21) Appl. No.: 16/667,360

(22) Filed: Oct. 29, 2019

(65) Prior Publication Data

US 2020/0066664 A1 Feb. 27, 2020

Related U.S. Application Data

(63) Continuation of application No. 15/797,638, filed on Oct. 30, 2017, now Pat. No. 10,483,221.

(51) Int. Cl.
*H01L 23/00* (2006.01)
*H01L 25/00* (2006.01)
*H01L 25/065* (2006.01)

(52) U.S. Cl.
CPC .............. *H01L 24/04* (2013.01); *H01L 24/13* (2013.01); *H01L 24/16* (2013.01); *H01L 24/81* (2013.01); *H01L 25/0657* (2013.01); *H01L 25/50* (2013.01); *H01L 2224/0219* (2013.01); *H01L 2224/02175* (2013.01); *H01L 2224/02185* (2013.01); *H01L 2224/0401* (2013.01); *H01L 2224/10145* (2013.01);
(Continued)

(58) Field of Classification Search
CPC .... H01L 25/0657; H01L 25/50; H01L 23/488
See application file for complete search history.

(56) References Cited

U.S. PATENT DOCUMENTS 6,208,156 B1  3/2001  Hembree
6,245,595 B1  6/2001  Nguyen et al.
(Continued)

FOREIGN PATENT DOCUMENTS

CN  101355038 A  1/2009
CN  101958259 A  7/2009
(Continued)

OTHER PUBLICATIONS

US Patent and Trademark Office; Office Action; U.S. Appl. No. 15/797,638; dated Sep. 10, 2018.
(Continued)

*Primary Examiner* — Peniel M Gumedzoe
(74) *Attorney, Agent, or Firm* — Parsons Behle & Latimer

(57) ABSTRACT

A substrate or semiconductor device, semiconductor device assembly, and method of forming a semiconductor device assembly that includes a barrier on a solder cup. The semiconductor device assembly includes a substrate disposed over another substrate. At least one solder cup extends from one substrate towards an under bump metal (UBM) on the other substrate. The barrier on the exterior of the solder cup may be a standoff to control a bond line between the substrates. The barrier may reduce solder bridging during the formation of a semiconductor device assembly. The barrier may help to align the solder cup with a UBM when forming a semiconductor device assembly and may reduce misalignment due to lateral movement of substrates and/or semiconductor devices.

14 Claims, 7 Drawing Sheets

(52) U.S. Cl.
CPC ............... *H01L 2224/13025* (2013.01); *H01L 2224/13147* (2013.01); *H01L 2224/13655* (2013.01); *H01L 2224/16148* (2013.01); *H01L 2224/81007* (2013.01); *H01L 2224/81815* (2013.01); *H01L 2225/06513* (2013.01); *H01L 2225/06541* (2013.01); *H01L 2225/06565* (2013.01); *H01L 2225/06596* (2013.01); *H01L 2924/01073* (2013.01); *H01L 2924/01074* (2013.01); *H01L 2924/04953* (2013.01); *H01L 2924/3841* (2013.01)

(56) References Cited

U.S. PATENT DOCUMENTS

| | | | |
|---|---|---|---|
| 6,734,568 | B2 | 5/2004 | Matsuo et al. |
| 6,747,472 | B2 * | 6/2004 | Magerlein ............ G01R 1/0416 |
| | | | 324/750.05 |
| 6,819,000 | B2 * | 11/2004 | Magerlein ......... H01L 23/49811 |
| | | | 257/777 |
| 8,202,797 | B2 | 6/2012 | Chi et al. |
| 2005/0221601 | A1 | 10/2005 | Kawano |
| 2007/0148817 | A1 | 6/2007 | Williams et al. |
| 2008/0315433 | A1 * | 12/2008 | Chen ....................... H01L 23/66 |
| | | | 257/777 |
| 2009/0189286 | A1 | 7/2009 | Daubenspeck et al. |
| 2010/0072631 | A1 | 3/2010 | Marion |
| 2010/0236822 | A1 | 9/2010 | Furutani et al. |
| 2011/0147440 | A1 | 6/2011 | Hu |
| 2011/0278732 | A1 * | 11/2011 | Yu ......................... H01L 23/481 |
| | | | 257/774 |
| 2012/0012998 | A1 * | 1/2012 | Chandrasekaran ..... H01L 24/03 |
| | | | 257/737 |
| 2012/0273938 | A1 | 11/2012 | Choi et al. |
| 2013/0313707 | A1 | 11/2013 | Choi et al. |
| 2014/0203428 | A1 | 7/2014 | Colgan et al. |
| 2014/0342545 | A1 | 11/2014 | Zhang |
| 2015/0064899 | A1 * | 3/2015 | Ji ............................. H01L 24/14 |
| | | | 438/614 |
| 2015/0303157 | A1 | 10/2015 | Uzoh et al. |
| 2015/0333026 | A1 * | 11/2015 | Gandhi .................... H01L 24/81 |
| | | | 257/737 |
| 2016/0155684 | A1 | 6/2016 | Lin et al. |
| 2016/0197055 | A1 | 7/2016 | Yu et al. |
| 2016/0204076 | A1 | 7/2016 | Lin et al. |
| 2016/0343689 | A1 | 11/2016 | Gandhi et al. |

FOREIGN PATENT DOCUMENTS

| | | |
|---|---|---|
| CN | 101593710 A | 12/2009 |
| CN | 101958259 B | 9/2014 |
| KR | 1020100043456 A | 4/2010 |
| KR | 1020120031636 A | 4/2012 |
| TW | 201539689 A | 10/2015 |

OTHER PUBLICATIONS

US Patent and Trademark Office; Final Office Action; U.S. Appl. No. 15/797,638; dated Feb. 21, 2019.

US Patent and Trademark Office; Office Action; U.S. Appl. No. 15/797,638; dated Apr. 11, 2019.

\* cited by examiner

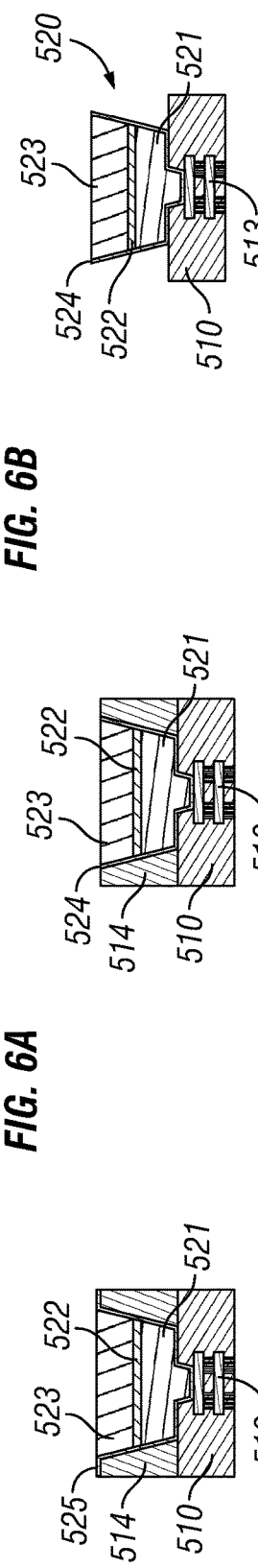
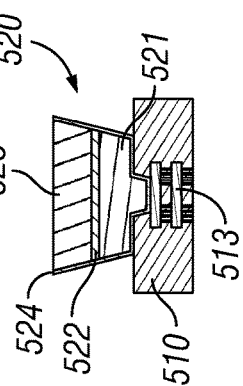
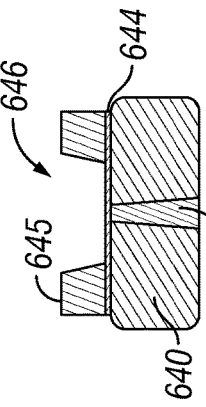
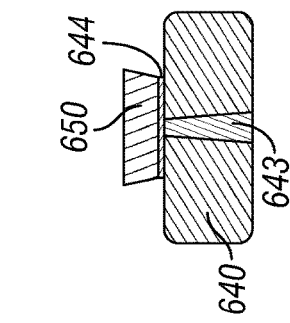
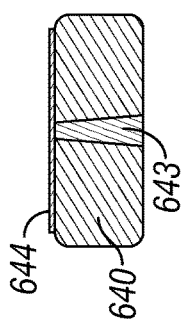
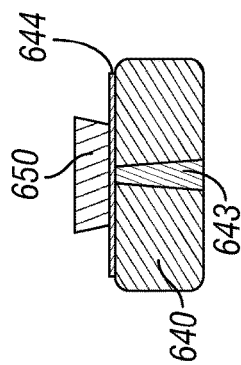
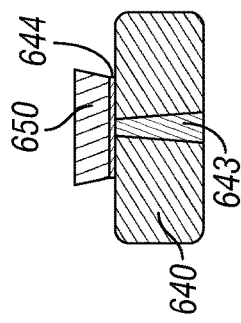
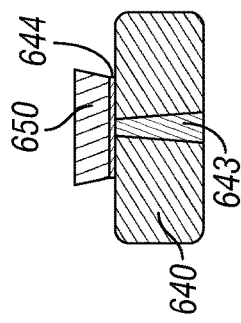

3DI SOLDER CUP

CROSS-REFERENCE TO RELATED APPLICATIONS

This application is a continuation of and claims priority to U.S. patent application Ser. No. 15/797,638, published as U.S. Patent App. Publication No. 2019/0131260, filed on Oct. 30, 2017, and entitled "3DI Solder Cup," the contents of which are hereby incorporated by reference herein.

FIELD

The embodiments described herein relate to semiconductor device assemblies having interconnect structures and methods of providing such semiconductor device assemblies. The present disclosure relates to a barrier surrounding pillar interconnects. The present disclosure also relates to the barrier providing a standoff to support a semiconductor device, such as a die, on a substrate.

BACKGROUND

Semiconductor device assemblies, including, but not limited to, memory chips, microprocessor chips, and imager chips, typically include a semiconductor device, such as a die, mounted on a substrate, the semiconductor device assembly may be encased in a plastic protective covering or metal heat spreader. The semiconductor device assembly may include various functional features, such as memory cells, processor circuits, and imager devices, and may include bond pads that are electrically connected to the functional features of the semiconductor device assembly. The semiconductor device assembly may include semiconductor devices stacked upon and electrically connected to one another by individual interconnects between adjacent devices within a package.

Various methods and/or techniques may be employed to electrically interconnect adjacent semiconductor devices and/or substrates in a semiconductor device assembly. For example, individual interconnects may be formed by reflowing tin-silver (SnAg), also known as solder, to connect a pillar to a pad. Individual interconnects may be formed by reflowing various materials such as, but not limited to, tin-silver-copper solder, indium, or the like, as would be recognized by one of ordinary skill in the art having the benefit of this disclosure. Typically, the pillar may extend down from a bottom surface of a semiconductor device towards a pad formed on the top surface of another semiconductor device or substrate. A pillar may have a base portion comprised of copper (Cu) and an end portion comprised of solder. The pillar may include a layer of nickel (Ni) positioned between the copper portion and the solder portion, which acts as a barrier to prevent copper mixing and consumption by the solder during reflow and subsequently prevents electromigration of the solder into the copper during the solder reflow process. However, in some instances solder flows out and around the nickel barrier to the copper portion of the pillar, often referred to as solder slumping, which may lead to copper consumption, intermetallics (IMC) issues, and possible shorting between pillars.

Various methods and/or techniques may be employed to support adjacent dies and/or substrates in a semiconductor device assembly. For example, thermal compression bonding (TCB) with non-conductive film (NCF), which may include a wafer level underfill (WLUF), is a technique that may be used to connect a semiconductor device to a substrate to create a semiconductor device assembly. As an example, underfill material, which may be a laminated sheet of film, is deposited onto a wafer comprising multiple dies. The wafer may be diced to form individual dies that are then bonded to a substrate. One potential disadvantage of WLUF is the presence of voids due to the topography (e.g., copper traces, solder mask) of the substrate. For example, the topography may inhibit WLUF from flowing outside the die area.

When forming a semiconductor device assembly it may be desired to have a specific bond line between the semiconductor device and the substrate or adjacent semiconductor device. During the bonding process, the force applied during the bonding process may need to be varied in an attempt to obtain the specified bond line. For example, when the NCF material is at a high viscosity state a higher force may need to be applied to obtain the desired bond line, but as the NCF is heated during the TCB process the viscosity of the NCF may decrease so that less force is required to obtain the desired bond line. The change in viscosity during the TCB process, which in turn causes a variation in the applied force may make it difficult to consistently obtain the desired bond line for the duration of the process.

A higher force applied during the TCB process may help to eliminate the WLUF voids, but the higher applied force may cause solder to unintentionally bridge across traces and/or interconnects of the semiconductor device assembly as would be appreciated by one of ordinary skill in the art. Alternatively, the solder thickness may be reduced to help eliminate bridging, but a reduced solder thickness may lead to metastable IMC issues as would be recognized by one of ordinary skill in the art.

Additional drawbacks and disadvantages may exist.

BRIEF DESCRIPTION OF THE DRAWINGS

FIGS. 6A-6E are schematic cross-section views of an embodiment illustrating forming a solder cup on a semiconductor device.

FIGS. 7A-7E are schematic cross-section views of an embodiment illustrating forming a UBM on a semiconductor device.

Figure 1:
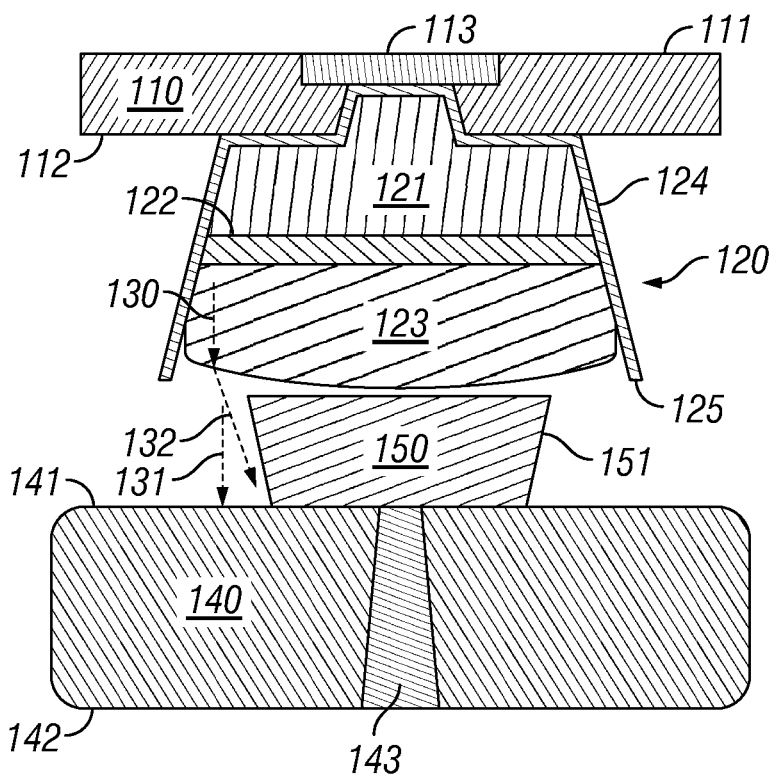
FIG. 1 is a schematic cross-section view of an embodiment of a second semiconductor device with a solder cup having an exterior barrier positioned above a first semiconductor device with an under bump metal (UBM) aligned with the solder cup.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure a semiconductor device assembly comprises a first substrate and a second substrate disposed over the first substrate, the second substrate has at least one solder cup having an exterior barrier that extends towards the first substrate.

The barrier on the exterior of the solder may help to prevent bridging between two adjacent interconnects and/or prevent bridging with another element as the substrates are bonded together to from a semiconductor device assembly. The barrier may act as a standoff, which may help to achieve a desired bond line between two substrates and/or semiconductor devices when forming a semiconductor device assembly. The solder cup and barrier may help with the alignment of a UBM on an adjacent substrate or semiconductor device and may also help to prevent misalignment with the UBM due to movement of the one substrate or semiconductor device with the respect to another substrate or semiconductor device.

FIG. 1 shows a schematic of a first semiconductor device 140, which may be a substrate, comprising a first or top surface 141 and a second or bottom surface 142 opposite the first surface 141. The first semiconductor device 140 includes an under bump metal (UBM) 150 formed on the first surface 141. The UBM 150 may be electrically connected to a via 143, which extends through the first semiconductor device 140. The sidewalls 151 of the UBM 150 on the first surface 141 of the first semiconductor device 140 may be angled or tapered, as shown in FIG. 1. Angled sidewalls 151 of the UBM 150 may increase the wetting force between the solder of an adjoining pillar in comparison to a UBM 150 having straight (i.e. perpendicular to the first surface 141) or non-tapered sidewalls 151, as discussed herein.

FIG. 1 shows a second semiconductor device 110, which may be a substrate, positioned adjacent to the first semiconductor device 140. The second semiconductor device comprising a first or top surface 111 and a second or bottom surface 112 opposite the first surface 111. The second device 110 includes a solder cup 120 formed on the second surface 112. The solder cup 120 comprises a pillar comprised of a copper portion 121, a nickel portion 122, and a solder portion 123 within an external barrier 124. Alternatively, the pillar may be comprised of solder 123 without a copper portion 121 or a nickel portion 122. The solder cup 120 is electrically connected to at least one interconnect 113 within the second semiconductor device 110. The barrier 124 may comprise a taper or funnel shape having a larger diameter at an open end 125 that is positioned away from the second surface 112 of the second semiconductor device 110 than the portion of the barrier 124 that is positioned adjacent to the second semiconductor device 110.

Figure 2:
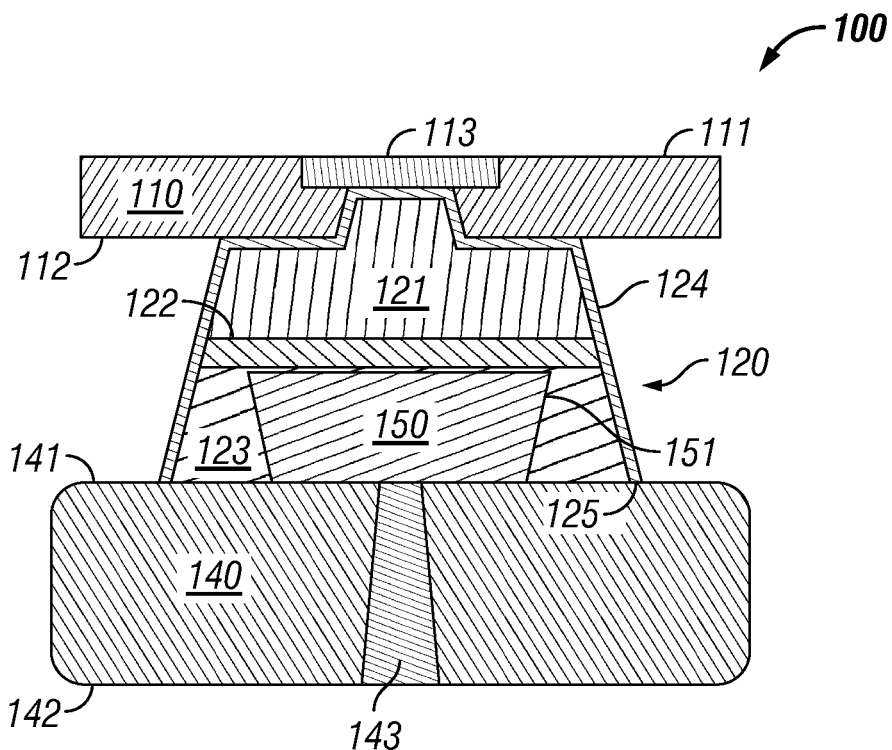
FIG. 2 is a schematic cross-section view of the first and second semiconductor devices of FIG. 1 with the exterior barrier of the solder cup of the second semiconductor device enclosing the UBM of the first semiconductor device.

FIG. 2 shows a semiconductor device assembly 100 formed of the first semiconductor device 140 connected to the second semiconductor device 110 via an interconnect formed between the solder cup 120 of the second semiconductor device 110 and the UBM 150 of the second semiconductor device 140. A TCB process may be applied so that molten solder in the solder cup 120 encases the UBM 150 to form an interconnection between the first semiconductor device 140 and the second semiconductor device 110. Wetting forces during the solder bonding process, which are illustrated in FIG. 1 as arrows 130, 131, and 132, help to pull the solder cup 120 towards the UBM 150. Angled sidewalls 151 of the UBM 150 may create a wetting force 132 that helps lock the solder cup 120 and the UBM 150 together. Likewise, wetting force 130 may act on the funnel-shaped walls of the barrier 124 and wetting force 131 may act on the solder 123 within the barrier 124 to help pull the solder cup 120, including the barrier 124, towards the first surface 141 of the first semiconductor device 140.

Conventional semiconductor devices are often electrically interconnected together by connecting a solder portion at an end of a pillar to a copper plated pad. The wetting forces during this bonding process only act at the interface between the end of the pillar and the pad. In contrast, the solder cup 120 encases or envelops the UBM 150 with solder 123. Thus, the wetting forces between the entire UBM 150 and the solder 123 within the barrier 124 are larger and help to lock the two structures together. The first surface 141 of the first semiconductor device 140 may contain a plurality of UBMs 150 and the second surface 112 of the second semiconductor device 110 may contain a plurality of solder cups 120 as would be appreciated by one of ordinary skill in the art having the benefit of this disclosure. The size, shape, number, and/or configuration of the first semiconductor device 110, solder cup 120, barrier 124, components within the barrier 124, second semiconductor device 140, and/or UBM 150 are for illustrative purposes only and may be varied as would be appreciated by one of ordinary skill in the art having the benefit of this disclosure. For example, the second semiconductor device 110 may include a plurality of solder cups 120 having barriers 124 that extend from the bottom surface 112 with each solder cup 120 aligned with a corresponding UBM 150 on the first surface 141 of the second semiconductor device 140. The UBM 150 may comprises various structures on a surface of a semiconductor device as would be appreciated by one of ordinary skill in the art having the benefit of this disclosure. For example, a UBM 150 may be, but is not limited to, a through silicon via pad, a bonding pad, a test or probe pad located on a surface of a semiconductor device, or the like.

The barrier 124 on the exterior of the solder cup 120 may act as a standoff during a TCB process, which may help to achieve a desired bond line between two semiconductor devices when forming a semiconductor device assembly. The barrier 124 on the exterior of the solder cup 120 may help with the alignment of the solder cup 120 with a UBM 150 on the top surface of an adjacent semiconductor device. The barrier 124 on the exterior of the solder cup 120 may help to prevent misalignment between a solder cup 120 and a UBM 150 on a top surface of an adjacent semiconductor device due to movement of the semiconductor devices with respect to each other. The barrier 124 on the exterior of the solder cup 120 may prevent bridging between adjacent interconnects. The barrier 124 on the exterior of the solder cup 120 may prevent the formation of whiskers on an interconnect between two adjacent semiconductor devices.

The end 125 of the barrier 124 will have a larger perimeter or diameter than a corresponding UBM 150 so that the barrier 124 can encircle, enclosed, or envelope the UBM 150. The end 125 of the barrier 124 enclosing the UBM 150 prevents molten solder 123 from flowing to an adjacent feature on the first surface 141 of the second semiconductor device 140. The larger perimeter or diameter of the end 125 of the barrier 124 enables the UBM 150 to be encased by molten solder 123 during the bonding process. In some instances, the UBM 150 may be completely encase by molten solder 123. The larger perimeter or diameter of the end 125 of the barrier 124 with respect to the UBM 150 may also enable better alignment between two adjacent semiconductor devices than the prior interconnection between pillars and pads as would be appreciated by one of ordinary skill in the art having the benefit of this disclosure. For example, warpage of a semiconductor device may cause an inadequate interconnect between traditional pillar and pad connections. However, warpage of one of the semiconductor devices may not be problematic between the interconnect between a solder cup 120 and UBM 150 because the barrier 124 of the solder cup 120 envelopes the UBM 150 permitting the UBM 150 to be encased with solder 123 within the solder cup 120.

The barrier 124 may be comprised of various materials that may be used to reduce potential bridging, act as a standoff, prevent the formation of whiskers, aid in alignment of a pillar with a pad, and/or prevent misalignment due to movement of adjacent semiconductor devices with respect to each other. For example, the barrier 124 may be comprised of, but not limited to, tantalum, tungsten, titanium nitride, and/or combinations thereof. The barrier 124 may be formed on the exterior of the pillar 120 by various processes as would be appreciated by one of ordinary skill in the art having the benefit of this disclosure. The thickness of the barrier 124 may vary depending on the application. For example, the thickness of the barrier may be, but is not limited to, 1000 angstroms to 5000 angstroms. Various mechanisms and/or materials may be used to form the barrier 130 on the exterior pillar 120 depending on the application as would be appreciated by one of ordinary skill in the art having the benefit this disclosure. The UBM 150 may be comprised of various materials that will form an interconnect with the solder 123 in the solder cup 120. For example, the UBM 150 may be comprised of, but not limited to, nickel, gold, and/or combinations thereof. As the UBM 150 is encased in solder 123, one embodiment of the UBM 150 may not comprise any copper.

A semiconductor device assembly 100 may be formed by providing at least one support between a first semiconductor device 140 and a second semiconductor device 110, the support providing mechanical support and/or thermal transfer between the first semiconductor device 140 and the second semiconductor device 110. The at least one support may comprise a solder cup that extends from a surface of a semiconductor device to a surface of an adjacent semiconductor device. The at least one support may comprise the solder cup 120 of the second semiconductor device 110 and the UBM 150 of the first semiconductor device 140 formed together. As discussed herein, a TCB process may be applied so that molten solder in the solder cup 120 encases the UBM 150 to form a mechanical support between the first semiconductor device 140 and the second semiconductor device 110. Wetting forces during the solder bonding process, which are illustrated in FIG. 1 as arrows 130, 131, and 132, help to pull the solder cup 120 towards the UBM 150. Angled sidewalls 151 of the UBM 150 may create a wetting force 132 that helps lock the solder cup 120 and the UBM 150 together. Likewise, wetting force 130 may act on the funnel-shaped walls of the barrier 124 and wetting force 131 may act on the solder 123 within the barrier 124 to help pull the solder cup 120, including the barrier 124, towards the first surface 141 of the first semiconductor device 140. A plurality of solder cups 120 and UBMs 150 may be used to connect together the first semiconductor device 110 and the second semiconductor device 140 to form a semiconductor device assembly 100 as would be appreciated by one or ordinary skill in the art having the benefit of this disclosure.

Figure 3A:
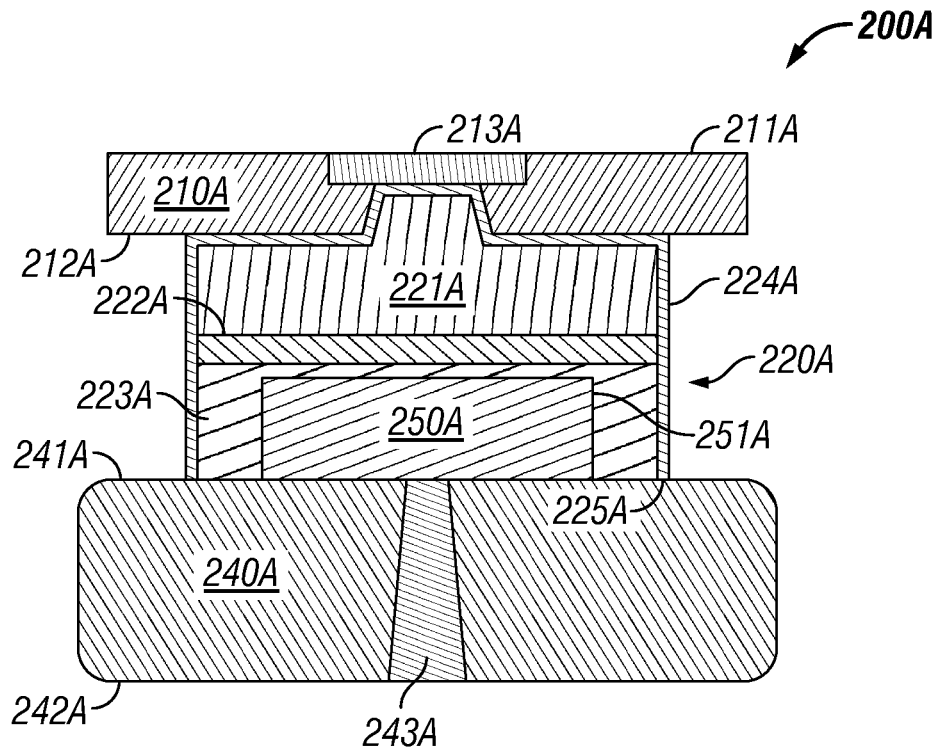
FIG. 3A is a schematic cross-section view of an embodiment of a semiconductor device assembly formed of a first semiconductor device having a UBM that is enclosed by a solder cup of a second semiconductor device.

FIG. 3A is a schematic cross-section view of an embodiment of a semiconductor device assembly 200A formed of a first semiconductor device 240A having a UBM 250A that is enclosed by a solder cup 220A of a second semiconductor device 210A. The solder cup 220A extends from a second or bottom surface 212A of the second semiconductor device 210A and is electrically connected to an interconnect 213A within the second semiconductor device 210A. The second or bottom surface 212A of the second semiconductor device 210A is opposite a top of first surface 211A. The solder cup 220A may contain copper 221A, nickel 222A, and solder 223A. The materials within the solder cup 220A may be varied as would be appreciated by one of ordinary skill in the art having the benefit of this disclosure. The barrier 224A on the solder cup 220A may be straight sidewalls as compared to the barrier 124 shown in FIGS. 1 and 2. The end 225A of the barrier 224A engages the top surface 241A of the first semiconductor device 240A and may act as a standoff to control the bond line between the first semiconductor device 240A and the second semiconductor device 210A.

The UBM 250A on the first or top surface 241A of the first semiconductor device 240A is electrically connected to a via 243A that extends from the bottom or second surface 242A of the first semiconductor device 240A to the top or first surface 241A of the first semiconductor device 240A. The interconnect 213A of the second semiconductor device 210A and the via 243A of the first semiconductor device 240A are shown for illustrative purposes and the shape, size, number, and/or location may be varied as would be appreciated by one of ordinary skill in the art.

As the UBM 150A is enclosed by the solder cup 220A, the size and shape of the UBM 150A can be varied. For example, the UBM 150A in FIG. 3A is wider than the UBM 250B in FIG. 3B. A larger difference between the diameter or perimeter of the open end of the barrier on the solder cup with respect to the diameter or perimeter of the UBM may enable a UBN to be more easily aligned with a solder cup even when one or both substrates may be warped to some extent.

Figure 3B:
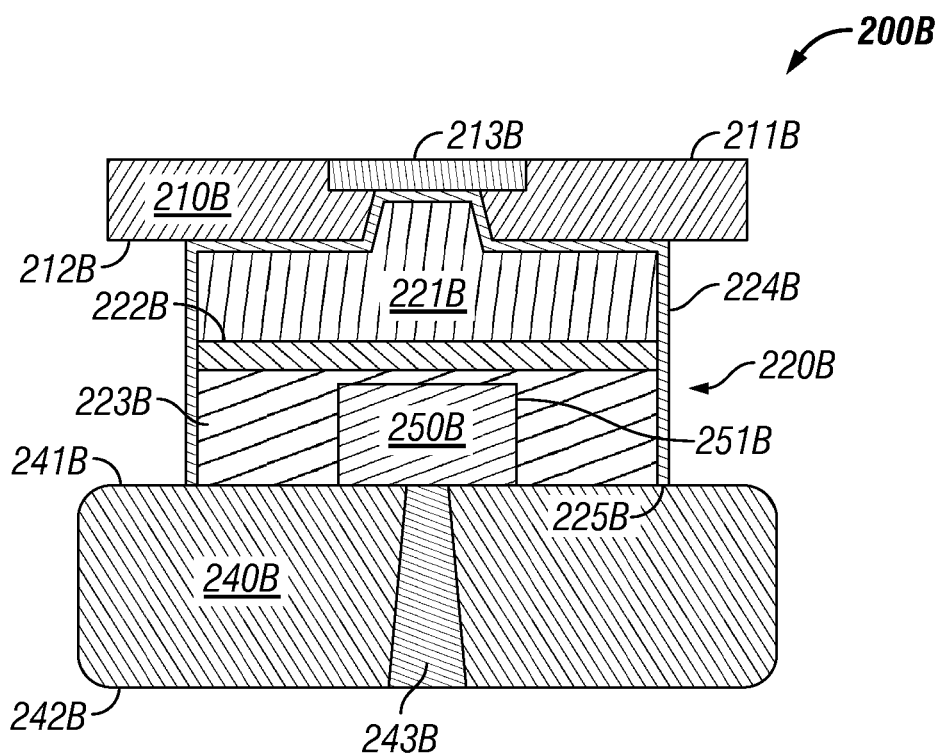
FIG. 3B is a schematic cross-section view of an embodiment of a semiconductor device assembly formed of a first semiconductor device having a UBM that is enclosed by a solder cup of a second semiconductor device.

FIG. 3B is a schematic cross-section view of an embodiment of a semiconductor device assembly 200B formed of a first semiconductor device 240B having a UBM 250B that is enclosed by a solder cup 220B of a second semiconductor device 210B. The solder cup 220B extends from a second or bottom surface 212B of the second semiconductor device 210B and is electrically connected to an interconnect 213B within the second semiconductor device 210B. The second or bottom surface 212B of the second semiconductor device 210B is opposite a top of first surface 211B. The solder cup 220B may contain copper 221B, nickel 222B, and solder 223B. The materials within the solder cup 220B may be varied as would be appreciated by one of ordinary skill in the art having the benefit of this disclosure. The barrier 224B on the solder cup 220B may be straight sidewalls. The end 225B of the barrier 224B engages the top surface 241B of the first semiconductor device 240B and may act as a standoff to control the bond line between the first semiconductor device 240B and the second semiconductor device 210B.

The UBM 250B on the first or top surface 241B of the first semiconductor device 240B is electrically connected to a via 243B that extends from the bottom or second surface 242B of the first semiconductor device 240B to the top or first surface 241B of the first semiconductor device 240B. The interconnect 213B of the second semiconductor device 210B and the via 243B of the first semiconductor device 240B are shown for illustrative purposes and the shape, size, number, and/or location may be varied as would be appreciated by one of ordinary skill in the art.

Figure 3C:
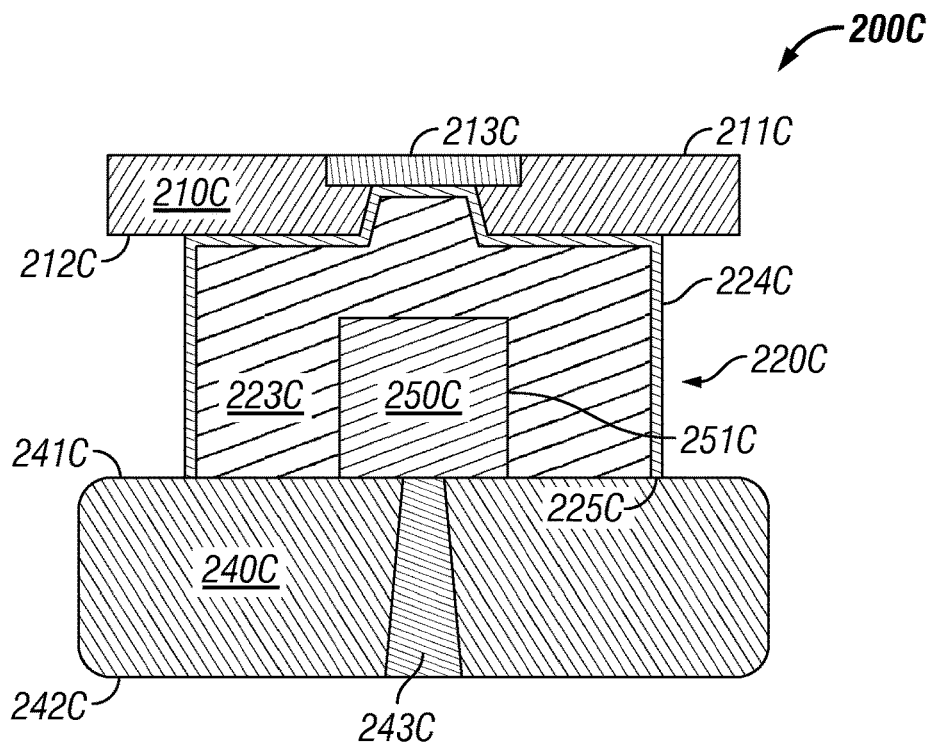
FIG. 3C is a schematic cross-section view of an embodiment of a semiconductor device assembly formed of a first semiconductor device having a UBM that is enclosed by a solder cup of a second semiconductor device.

The use of a solder cup 220C and barrier 224C enables the height of a UBM 250C to be varied as shown in FIG. 3C. The height of a UBM 250C may not affect the bond line between to substrates as the UBM 250C is enclosed within the barrier 225C, which acts as a standoff to better control the bond line between the substrates. As shown in FIG. 3C, the solder cup 220C may be comprised entirely of solder 223C.

FIG. 3C is a schematic cross-section view of an embodiment of a semiconductor device assembly 200C formed of a first semiconductor device 240C having a UBM 250C that is enclosed by a solder cup 220C of a second semiconductor device 210C. The solder cup 220C extends from a second or bottom surface 212C of the second semiconductor device 210C and is electrically connected to an interconnect 213C within the second semiconductor device 210C. The second or bottom surface 212C of the second semiconductor device 210C is opposite a top of first surface 211C. The solder cup 220C may contain solder 223C. The materials within the solder cup 220C may be varied as would be appreciated by one of ordinary skill in the art having the benefit of this disclosure. The barrier 224C on the solder cup 220C may be straight sidewalls. The end 225C of the barrier 224C engages the top surface 241C of the first semiconductor device 240C and may act as a standoff to control the bond line between the first semiconductor device 240C and the second semiconductor device 210C.

The UBM 250C on the first or top surface 241C of the first semiconductor device 240C is electrically connected to a via 243C that extends from the bottom or second surface 242C of the first semiconductor device 240C to the top or first surface 241C of the first semiconductor device 240C. The interconnect 213C of the second semiconductor device 210C and the via 243C of the first semiconductor device 240C are shown for illustrative purposes and the shape, size, number, and/or location may be varied as would be appreciated by one of ordinary skill in the art.

Figure 4A:
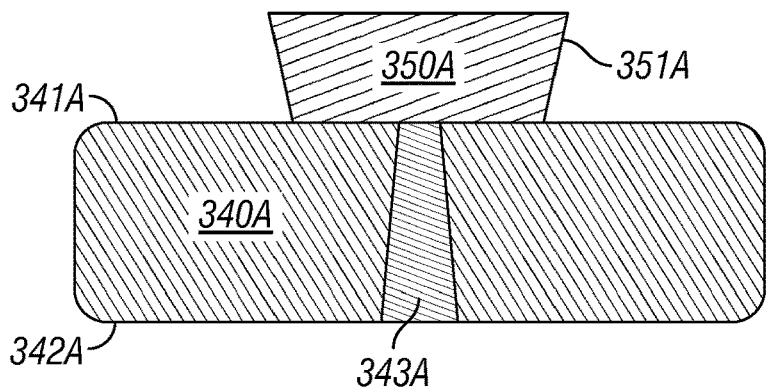
FIG. 4A is schematic cross-section view of an embodiment of a semiconductor device having a UBM.

FIG. 4A is schematic cross-section view of an embodiment of a semiconductor device or substrate 340A having a UBM 350A on a first or top surface 341A. The substrate 340A includes a second surface 342A opposite the first surface 341A. The UBM 350A may be connected to a via 343A that extends through the substrate 340A from the first surface 341A to the second surface 342A. The sidewalls 351A of the UBM 350A may be angled (i.e., not substantially perpendicular) with respect to the first surface 341A.

Figure 4B:
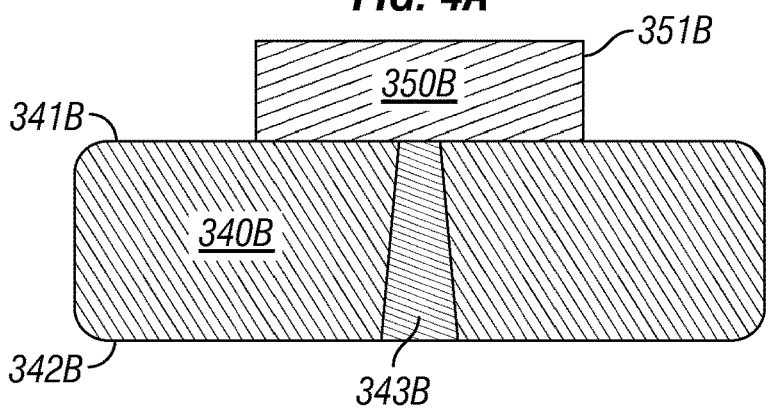
FIG. 4B is schematic cross-section view of an embodiment of a semiconductor device having a UBM.

FIG. 4B is schematic cross-section view of an embodiment of a semiconductor device or substrate 340B having a UBM 350B on a first or top surface 341B. The substrate 340B includes a second surface 342B opposite the first surface 341B. The UBM 350A may be connected to a via 343B that extends through the substrate 340B from the first surface 341B to the second surface 342B. The sidewalls 351B of the UBM 350A may be angled substantially perpendicular with respect to the first surface 341B. In one embodiment, the UBMs 350A, 350B on the first surfaces 341A, 341B may formed from vias 343A, 343B that extend through the substrates 340A, 340B. For example, material, except the via 343A, 343B, may be removed from the first surfaces 341A, 341B until the via 343A, 343B becomes a UBM on the first surface 341A, 343B of the substrate 340A, 340B. Various processes may be used to remove material from the surface of a substrate and form the via into a UBM as would be appreciated by one of ordinary skill in the art having the benefit of this disclosure.

Figure 5:
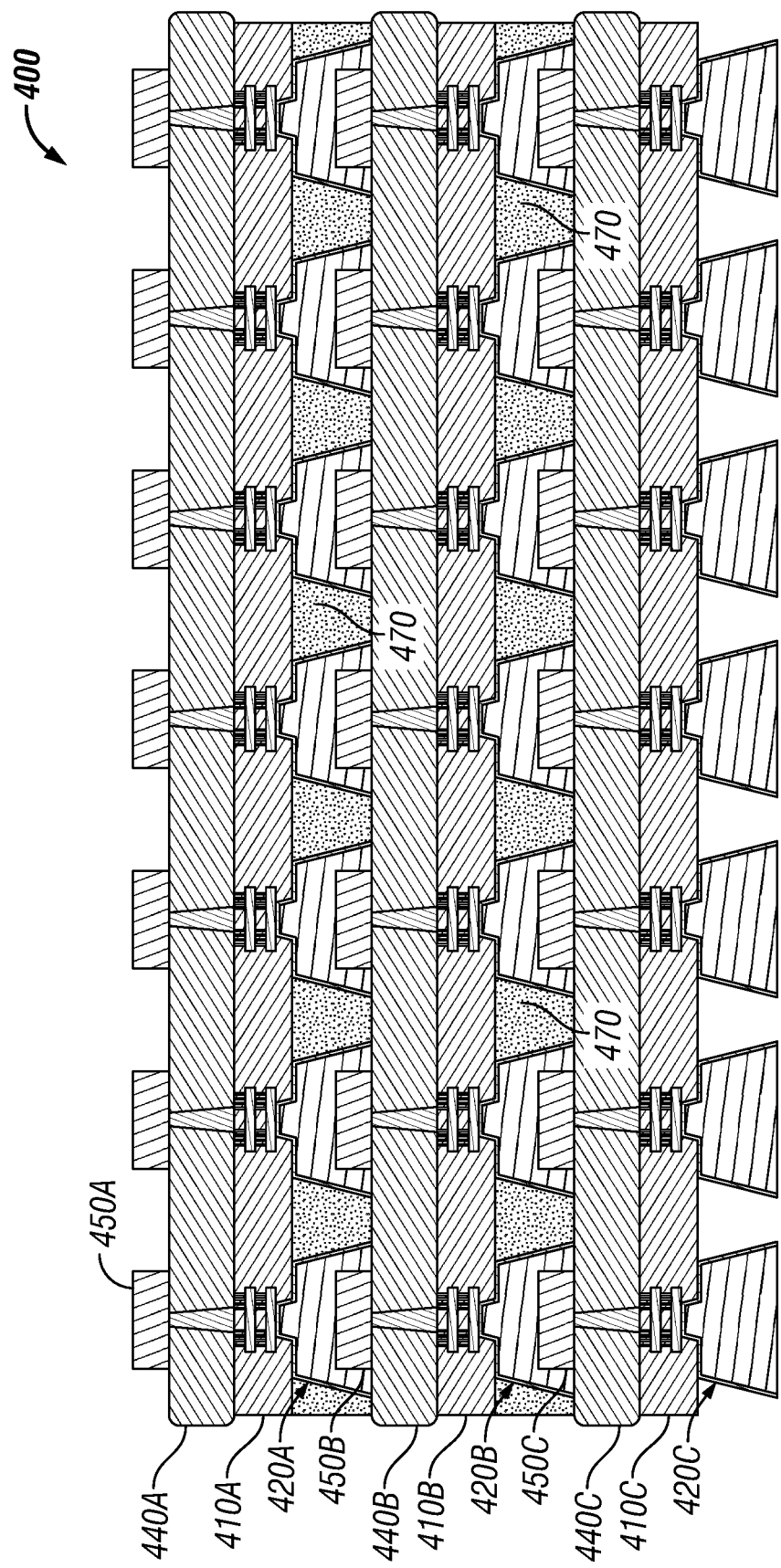
FIG. 5 is a schematic cross-section view of an embodiment of a semiconductor device assembly.

FIG. 5 shows a schematic cross-section view of an embodiment of a semiconductor device assembly 400. The semiconductor device assembly 400 includes a plurality of first semiconductor devices 440A, 440B, 440C each having a plurality of UBMs 450A, 450B, 450C on a top or first surface and a plurality of second semiconductor devices 410A, 410B, 410C having a plurality of solder cups 420A, 420B, 420C on a bottom or second surface. The solder cups 420A, 420B, 420C and UBMs 450A, 450B, 450C form interconnects between adjacent semiconductor devices. For example, a plurality of solder cups 420A of a second semiconductor device 410A form interconnects with a plurality of UBMs 450B of a first semiconductor device 440B. The semiconductor device assembly 400 includes NCF material 470 between the plurality of semiconductor devices 410A, 440B, 410B, 440C. The number, shape, size, and/or configuration of the first semiconductor devices 410A, 410B, 410C, second semiconductor devices 440A, 440B, 440C, solder cups 420A, 420B, 420C, and/or UBMs 450A, 450B, 450C are shown for illustrative purposes and may be varied depending on the application as would be appreciated by one of ordinary skill in the art having the benefit of this disclosure.

FIGS. 6A-6E are schematic cross-section views that illustrate an embodiment of forming a solder cup 520 (best shown in FIG. 6E) on a semiconductor device or substrate 510. The solder cup 520 may be formed to be electrically connected to an interconnect 513 within the substrate 510 as would be appreciated by one of ordinary skill in the art having the benefit of this disclosure. In a first step, a mask 514 is applied to the surface of the substrate 510 as shown in FIG. 6A. The mask 514 is configured in a desired shape of the solder cup 520. The mask 514 may be photo resist. A layer 524 is applied to the mask 514 and the top surface of the substrate 510 as shown in FIG. 6B. The layer 524 forms a barrier to the solder cup, as discussed herein.

Various metals may then be used to fill an opening, recess, or interior 526 within the barrier layer 524 as shown in FIG. 6C. The solder cup may be comprised of copper 521, nickel 522, and solder 523. Alternatively, different elements may be used in conjunction with solder 523 or the solder cup may be filled solely with solder 523. The top layer of the barrier layer 524 and solder 523 may be removed as shown in FIG. 6D. Afterwards, the resist 514 may be stripped off the top surface of the substrate 510 to leave the solder cup 520 having an exterior barrier 524 with the interior comprising solder that may be used to make an interconnection with a UBM on an adjacent substrate.

FIGS. 7A-7E are schematic cross-section views that illustrate an embodiment of forming a UBM 650 (best shown in FIG. 7E) on a semiconductor device or substrate 640. The UBM 650 may be formed to be electrically connected to a via 643 within the substrate 640 as would be appreciated by one of ordinary skill in the art having the benefit of this disclosure. In a first step, a seed barrier 644 may be formed on the top or first surface of the substrate 640 as shown in FIG. 7A. The seed barrier 644 may be comprised of various materials as would be appreciated by one of ordinary skill in the art having the benefit of this disclosure. In an embodiment, the seed barrier 644 may not include any copper. A resist layer 645 is then applied to the top of the seed barrier 644 as shown in FIG. 7B. The resist layer 645 is formed on the outside or perimeter of the substrate 640 leaving an opening, recess, or interior 646 for the formation of a UBM 650, as discussed herein. The resist layer 645 may include tapered or angled sidewalls, which may increase the wetting force between a solder cup and a UBM, as discussed herein.

A UBM 650 is then formed within recess 646 of the resist layer 645 as shown in FIG. 7C. The UBM 650 may be comprised of various materials that may form an interconnect with a solder cup as would be appreciated by one of ordinary skill in the art having the benefit of this disclosure. In an embodiment, the UBM 650 may be comprised of nickel. In an embodiment, the UBM 650 may not include copper. The resist layer 645 may be stripped off the top surface of the substrate 540 as shown in FIG. 7D and the seed layer 644 may be stripped off the top surface of the substrate 540 as shown in FIG. 7E to leave the UBM 650 that may be used to make an interconnection with a solder cup on an adjacent substrate.

Figure 8:
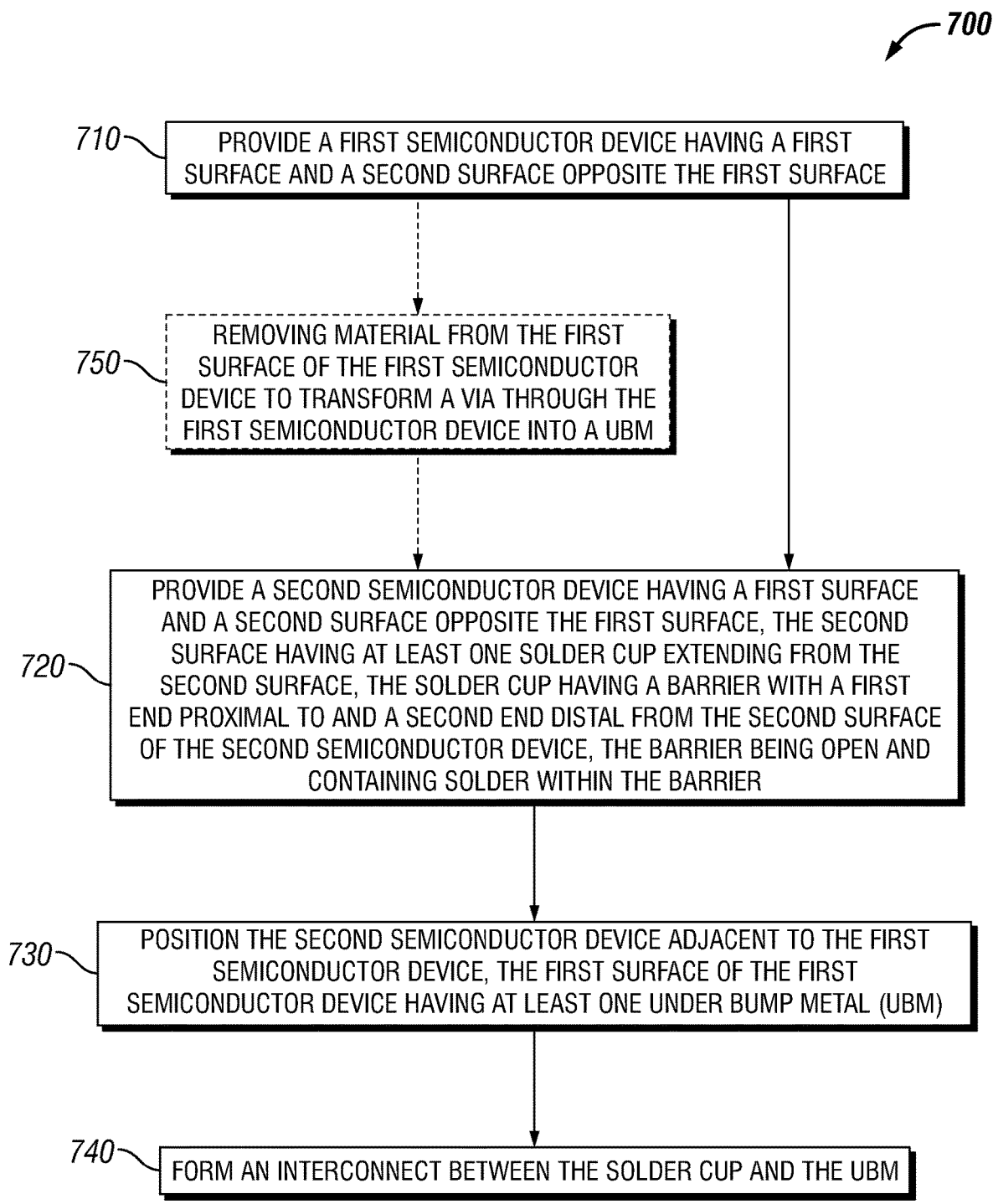
FIG. 8 is a flow chart depicting one embodiment of a method of making a semiconductor device assembly.

FIG. 8 is a flow chart for one embodiment of a method 700 of making a semiconductor device assembly. The method 700 includes providing a first semiconductor device that has a first surface and a second surface opposite the first surface, at step 710. The method comprises providing a second semiconductor device that has a first surface and a second surface opposite the first surface with at least one solder cup extending from the second surface, at step 720. The solder cup includes a barrier with a first end that is proximal to and a second end distal from the second surface of the second semiconductor device. The barrier is open at the distal end and contains solder within the barrier. At step 730, the method 700 includes positioning the second semiconductor device adjacent to the first semiconductor device with the first surface of the semiconductor device having at least one UBM. The method 700 includes forming an interconnect between the solder cup and the UBM, at step 740. Forming the interconnect may include a TCB step in which at least a portion of the barrier is used to set the bond line between the first semiconductor device and the second semiconductor device. Optionally, the method 700 may include step 750 of removing material from the first surface of the first semiconductor device to transform a via through the first semiconductor device into a UBM.

Figure 9:
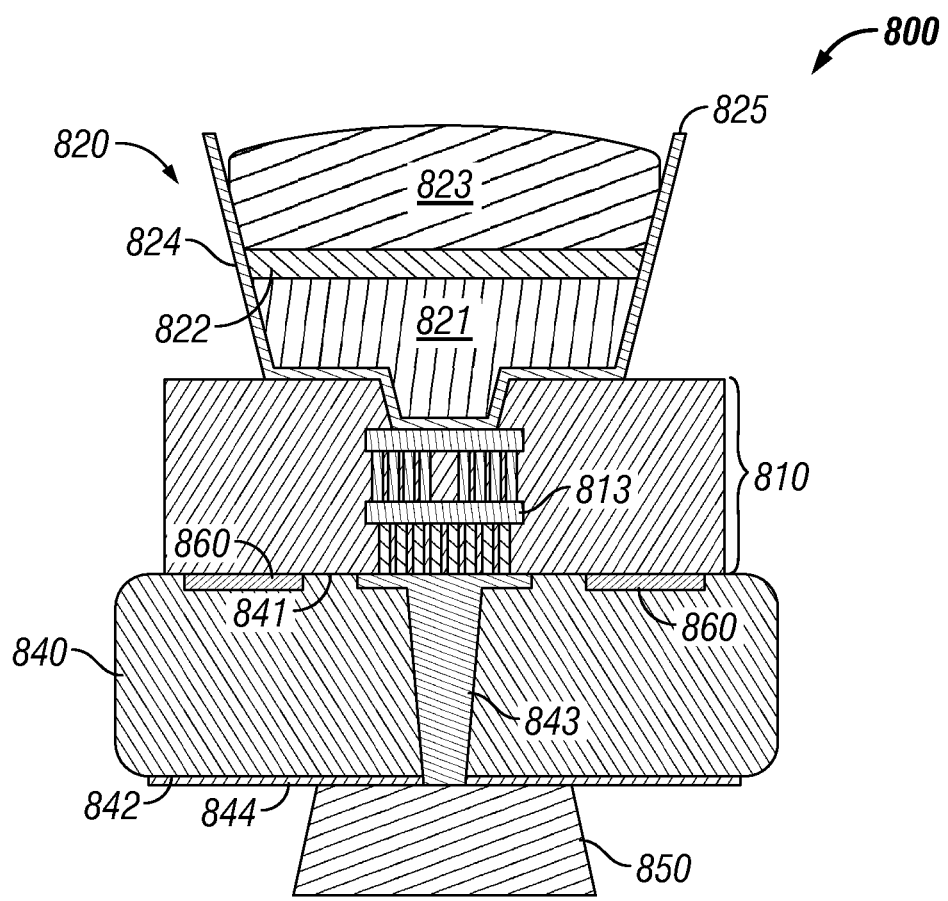
FIG. 9 is a schematic cross-section view of an embodiment of a semiconductor device having a solder cup and a UBM.

FIG. 9 is a schematic cross-section view of an embodiment of a semiconductor device 800 having a solder cup 820 and a UBM 850. The semiconductor device 800 includes a substrate 840 having a first or top surface 841, a second or bottom surface 842, and a via 843 that extends from the top surface 841 to the bottom surface 842. Active devices 860 may be positioned on the top surface 841 of the substrate 840 and may be electrically connected to both the solder cup 820 and the UBM 850. Various active device 860 may be included in the semiconductor device 800 as would be appreciated by one of ordinary skill in the art having the benefit of this disclose. For example, the active devices 860 may be, but are not limited to, a diode, transistor, an integrated circuit, or the like. The number, size, configuration, and/or location of the active devices 860 are shown for illustrative purposes only and may be varied depending on the application.

A number of layers, referred to collectively as layers 810, may be deposited on the top surface 841 of the substrate 840. Although shown as a single layer for clarity in FIG. 9, the layers 810 may be formed by depositing multiple layers of material until a desired thickness, shape, and/or configuration is achieved as would be appreciated by one of ordinary skill in the art having the benefit of this disclosure. The layers 810 may be passivation layers, which may cover the active devices 860. A solder cup 820 is formed on top of the layers 810 that are on the top surface 841 of the substrate 840. The solder cup 820 may be comprised of solder 823, nickel 822, and copper 821 within an exterior, or external, barrier 824, as discussed herein. The barrier 824 having a proximal end towards the substrate 410 and a distal end 825 that is open. The distal end 825 of the barrier 824 may act as a standoff when the semiconductor device 810 is positioned adjacent another semiconductor device for form a semiconductor device assembly, as discussed herein. A UBM 850 is formed on the bottom surface 842 of the substrate 840, which may include a passivation layer 844. Metal layers and/or electrical routing, such as traces, or the like, may be embedded within the layers 810 to electrically connect the solder cup 820 and the UBM 850 as would be appreciated by one of ordinary skill in the art having the benefit of this disclosure.

The semiconductor device 800 includes a solder cup 820 on one side and a UBM 850 on the other side. An interconnect may be formed between the solder cup 820 on the top of the semiconductor device 800 and a UBM on an adjacent semiconductor device. Likewise, an interconnect may be formed between the UBM 850 on the bottom of the semiconductor device and a solder cup on an adjacent semiconductor device. A plurality of semiconductor devices 800 may be joined together to form a semiconductor device assembly, similar to the semiconductor device assembly shown in FIG. 5, as would be appreciated by one of ordinary skill in the art having the benefit of this disclosure.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A device comprising:
   a substrate;
   an electrical interconnect within the substrate;
   a barrier structure electrically connected to the electrical interconnect, the barrier structure having a funnel-shaped recess defined therein, wherein the funnel-shaped recess is narrower at a first position adjacent to the substrate than at a second position further from the substrate than the first position;
   a copper structure positioned within the funnel-shaped recess of the barrier structure, wherein the copper structure is distinct from the barrier structure and in contact with the barrier structure; and
   solder positioned within the funnel-shaped recess of the barrier structure, wherein at least a portion of the solder is in contact with an inner wall of the funnel-shaped recess of the barrier structure
   a nickel structure positioned within the funnel-shaped recess of the barrier structure, wherein the nickel structure is distinct from the barrier structure and in contact with the barrier structure.

2. The device of claim 1, wherein the barrier structure comprises tantalum, tungsten, titanium nitride, or combinations thereof.

3. The device of claim 1, further comprising:
   a semiconductor device having a via and an under bump metal (UBM) electrically connected to the via, and wherein the UBM is encased in the solder within the funnel-shaped recess of the barrier structure.

4. The device of claim 3, wherein the UBM includes angled sidewalls.

5. The device of claim 4, wherein the angled sidewalls of the UBM are configured to produce a wetting force between the substrate and the semiconductor device during thermal compression bonding.

6. The device of claim 3, wherein the barrier structure and the UBM form an interconnect that electrically connects the electrical interconnect with the semiconductor device.

7. The device of claim 3, wherein the UBM comprises nickel or gold.

8. The device of claim 3, wherein the UBM is a through silicon via (TSV) pad, a bonding pad, a test pad, or a probe pad.

9. A device comprising:
   a first semiconductor device having a first side and a second side, the first semiconductor device comprising:
   a substrate;
   a via within the substrate; and
   an under bump metal (UBM) positioned on the first side of the first semiconductor device and electrically connected to the via; and
   a second semiconductor device having a first side and a second side, the second semiconductor device comprising:
   a substrate;
   an electrical interconnect within the substrate;
   a barrier structure electrically connected to the electrical interconnect, the barrier structure having a funnel-shaped recess defined therein, the funnel-shaped recess narrower at a first position adjacent to the substrate than at a second position further from the substrate than the first position
   at least one metal structure within the funnel-shaped recess of the barrier structure, wherein the at least one metal structure is distinct from the barrier structure and in contact with the barrier structure; and
   solder positioned within the funnel-shaped recess of the barrier structure, wherein the UBM is encased in the solder within the funnel-shaped recess of the barrier structure, and wherein at least a portion of the solder is in contact with an inner wall of the funnel-shaped recess of the barrier structure.

10. The device of claim 9, further comprising:
    at least one metal structure within the funnel-shaped recess of the barrier structure.

11. The device of claim 10, wherein the at least one metal structure includes copper or nickel.

12. The device of claim 9, wherein the UBM includes angled sidewalls.

13. The device of claim 9, wherein the barrier structure and the UBM form an interconnect that electrically connects the first semiconductor device with the second semiconductor device.

14. The device of claim 9, wherein the barrier structure comprises tantalum, tungsten, titanium nitride, or combinations thereof.

* * * * *